United States Patent
Phan et al.

(10) Patent No.: US 8,824,230 B2
(45) Date of Patent: Sep. 2, 2014

(54) METHOD AND APPARATUS OF REDUCING LEAKAGE POWER IN MULTIPLE PORT SRAM MEMORY CELL

(75) Inventors: Michael ThaiThanh Phan, Cary, NC (US); Manish Garg, Morrisville, NC (US); David Paul Hoff, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 511 days.

(21) Appl. No.: 13/249,297

(22) Filed: Sep. 30, 2011

(65) Prior Publication Data

US 2013/0083613 A1  Apr. 4, 2013

(51) Int. Cl.
*G11C 7/00* (2006.01)

(52) U.S. Cl.
USPC ............................. 365/203; 365/227

(58) Field of Classification Search
CPC .............. G11C 2207/2227; G11C 2211/4068; G11C 7/1006
USPC .................................. 365/203, 227
See application file for complete search history.

(56) References Cited

U.S. PATENT DOCUMENTS

| | | | |
|---|---|---|---|
| 5,631,872 A * | 5/1997 | Naritake et al. | 365/203 |
| 5,959,925 A * | 9/1999 | Tatsumi | 365/189.05 |
| 7,082,073 B2 * | 7/2006 | Casper | 365/203 |
| 7,466,609 B2 * | 12/2008 | Takahashi et al. | 365/226 |
| 7,564,725 B2 | 7/2009 | Houston | |
| 7,619,916 B2 | 11/2009 | Goel | |
| 2006/0120193 A1 * | 6/2006 | Casper | 365/203 |
| 2007/0242498 A1 | 10/2007 | Chandrakasan et al. | |
| 2007/0280025 A1 * | 12/2007 | Takahashi et al. | 365/226 |
| 2009/0251984 A1 | 10/2009 | Jung et al. | |
| 2010/0118597 A1 * | 5/2010 | Song et al. | 365/149 |
| 2010/0182823 A1 | 7/2010 | Garg et al. | |
| 2010/0254199 A1 | 10/2010 | Houston | |
| 2010/0296334 A1 | 11/2010 | Houston et al. | |
| 2011/0149666 A1 | 6/2011 | Chang et al. | |

OTHER PUBLICATIONS

International Search Report and Written Opinion—PCT/US2012/058178—ISA/EPO—Feb. 13, 2013.

* cited by examiner

*Primary Examiner* — Tuan T Nguyen
(74) *Attorney, Agent, or Firm* — Peter Michael Kamarchik; Nicholas J. Pauley; Joseph Agusta (57) ABSTRACT

Systems and method for reducing leakage currents and power consumption in a memory array comprising memory cells, such as 8T SRAM cells. The memory array includes logic for dynamically placing a group of memory cells in the memory array in a reduced power state during sleep mode or inactive states of the group of memory cells, such that leakage parts are effectively eliminated. The memory array further includes logic for dynamically enabling a selected group of the memory cells during read or write access operations on the selected memory cells, wherein corresponding read or write bitlines are precharged before and after the respective rear or write operations.

58 Claims, 11 Drawing Sheets

Conventional 6T SRAM

FIG. 1

FIG. 2
Conventional 8T SRAM

METHOD AND APPARATUS OF REDUCING LEAKAGE POWER IN MULTIPLE PORT SRAM MEMORY CELL

FIELD OF DISCLOSURE

Disclosed embodiments are directed to reducing leakage power in memory arrays. More particularly, exemplary embodiments are directed reducing leakage currents and power consumption in a memory array comprising memory cells, such as 8 Transistor Static Random Access Memory (8T SRAM) cells.

BACKGROUND

SRAM devices are known in the art for high speed memory applications, such as high performance processor caches. The structure of a conventional SRAM cell comprises two cross-coupled inverters, typically formed from four Complementary Metal Oxide Semiconductor ("Complementary MOS" or "CMOS") transistors. The cross-coupled inverters form the basic storage element, with two stable states which represent the complementary binary values "0" and "1". Two access transistors, serve to control access to the storage element during read and write operations. Accordingly, a conventional SRAM cell architecture involves six transistors, and is generally referred to as a 6T SRAM cell.

Figure 1:
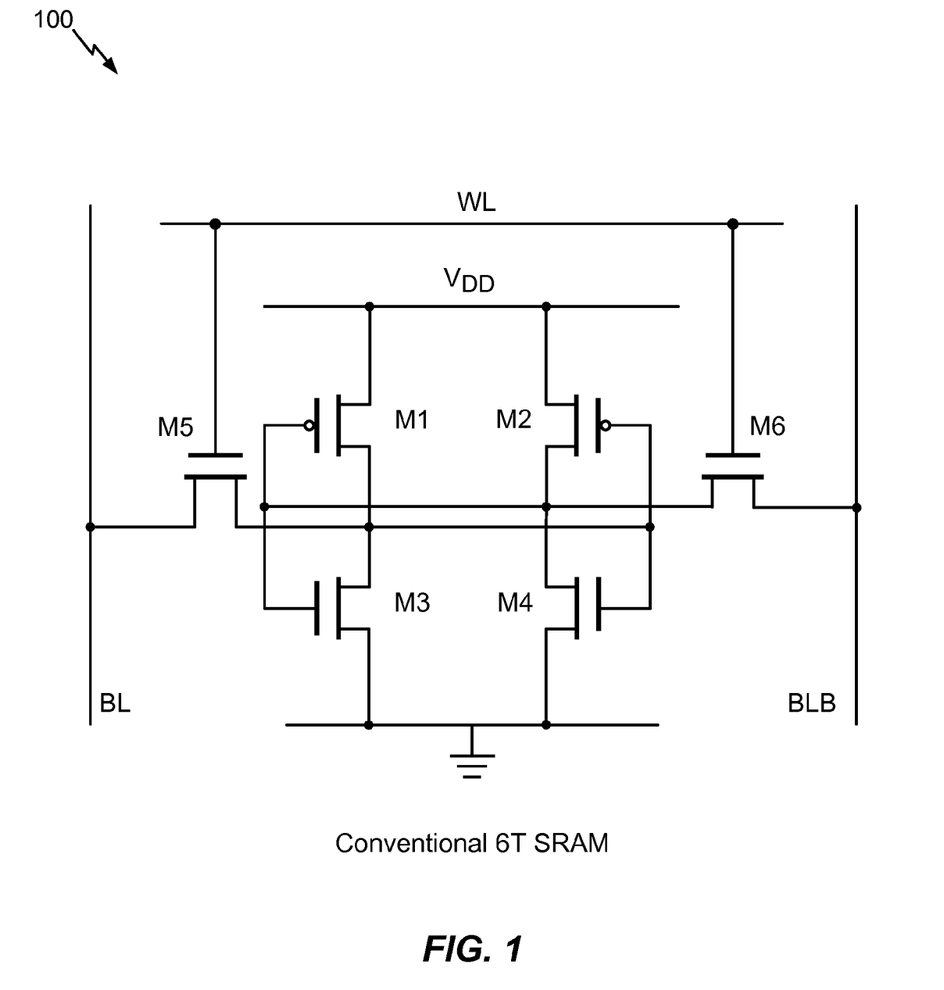
FIG. 1 illustrates a conventional 6T SRAM.

FIG. 1 illustrates a conventional 6T SRAM cell 100. The storage element comprises transistors M1-M4. A write operation on cell 100 is initiating by driving a 0 or 1 through complementary bitlines BL and BLB and word line WL to positive power supply voltage VDD. Access transistors M5 and M6 write the values on complementary bitlines into the storage element. In a read operation, complementary bitlines BL and BLB are both precharged to a predefined value, usually, VDD. Once word line WL is activated, the complementary values stored in the storage element act to discharge one of the complementary bitlines, say BL, while the other complementary bitline BLB is maintained at the precharge voltage. Sense amplifiers (not shown) quickly detect the differential values of the discharged bitline BL and the precharged complementary bitline BLB and read out a 0 accordingly.

With shrinking device sizes in nanometer technologies, the MOS transistors used in conventional 6T SRAM cell 100 are subject to increasing demands for meeting performance targets. However, the SRAM circuitry is restrained to low operating voltages, in order to reduce power consumption. Random doping fluctuations limit the operation of SRAM cells at low operating voltages. The combination of small device sizes and low operating voltages causes memory devices such as SRAM to lag behind speed and performance metrics of other logic circuits in processing systems.

Figure 2:
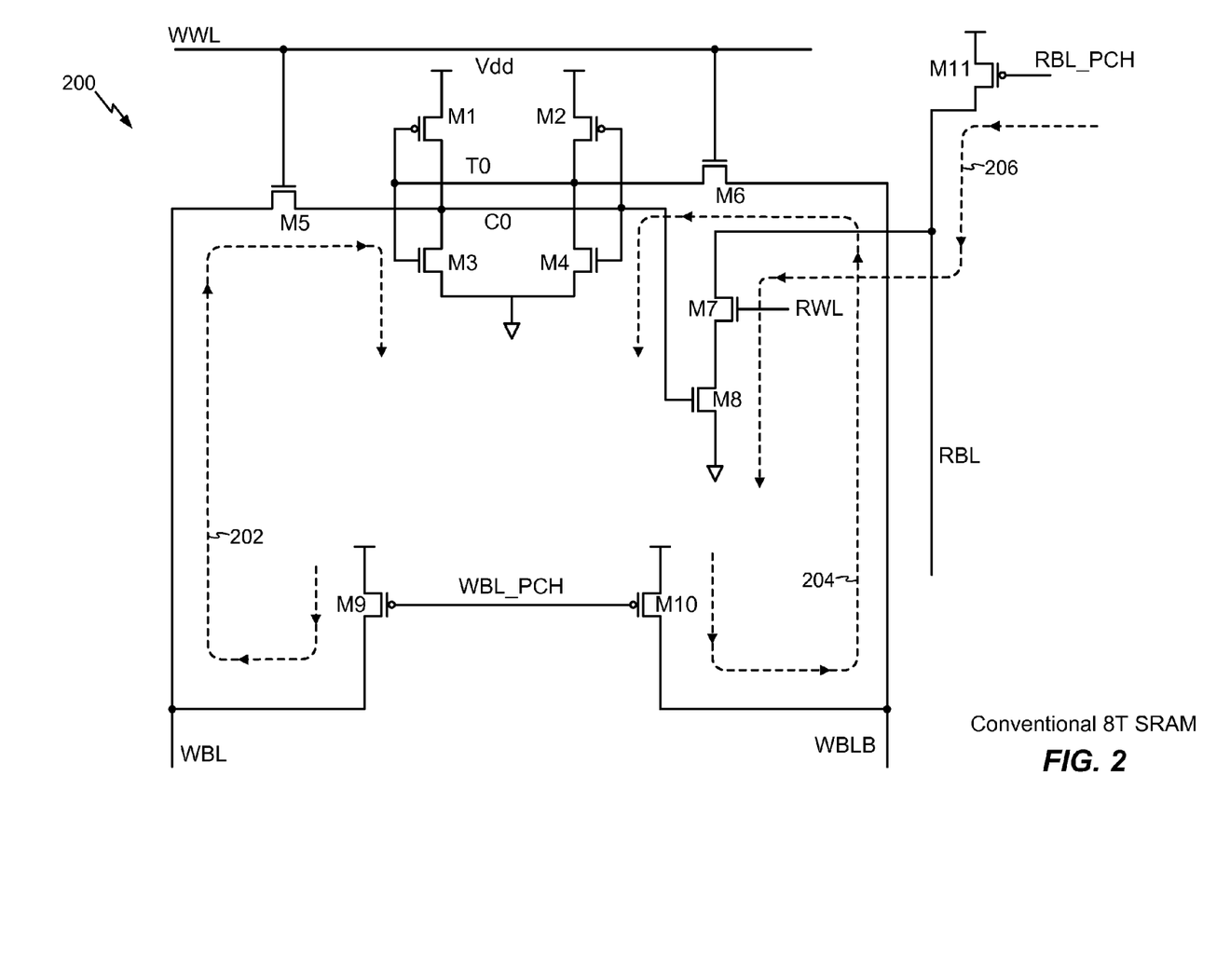
FIG. 2 illustrates a conventional 8T SRAM.

One approach to overcome the above limitations of 6T SRAMs includes an 8-transistor (8T) configuration for SRAM cells. FIG. 2 illustrates a conventional 8T SRAM cell 200. As illustrated, transistors M7 and M8 are added to a 6T SRAM cell circuit, such as 6T SRAM cell 100, in order to improve performance during read access operation. Accordingly, the eight transistors, M1-M8 form 8T SRAM cell 200. During write operations, write word line WWL is enabled. Write word line WWL and complementary write bitlines WBL and WBLB are coupled to the storage element (transistors M1-M4) through write access transistors M5 and M6. During read operations, read word line RWL is enabled, and read access transistors M7 and M8 couple the storage element to read bitline RBL. Thus, in contrast to 6T SRAM cell 100, 8T SRAM cell 200 provides separate access paths to the storage element during read and write operations.

Precharge transistors M9, M10, and M11 are configured to precharge write bitlines WBL and WBLB, and read bitline RBL. The write and read bitlines are precharged when 8T SRAM cell 200 is inactive, or in sleep mode. Precharging 8T SRAM cell 200 in this manner, overcomes some of the limitations associated with low operating voltage and low performance for 6T SRAMs as described above.

However, conventional implementations of 8T SRAM cells, such as 8T SRAM cell 200, suffer from additional drawbacks. For instance, the leakage current of 8T SRAM cell 200 is much higher than the leakage current of 6T SRAM cell 100. Because precharge transistors M9, M10, and M11 are configured for precharging the write and read bitlines, these precharge transistors are always turned on when 8T SRAM cell 200 is inactive or in standby mode. As a result, these precharge transistors give rise to leakage paths 202, 204, and 206 as shown. Leakage path 202 arising from precharging write bitline WBL is formed from VDD to ground through transistors M9, M5, and M3 as shown. Similarly, leakage path 204 arising from precharging write bitline WBLB is formed from VDD to ground through transistors M10, M6, and M4. Finally, leakage path 206 arising from precharging read bitline RBL is formed from VDD to ground through transistors M11, M7, and M8.

The leakage paths 202, 204, and 206 result in wastage of power and performance degradation. Accordingly, there is a need in the art for 8T SRAM cell designs which overcome the aforementioned drawbacks of conventional 8T SRAM implementations.

SUMMARY

Exemplary embodiments of the invention are directed to systems and method for reducing leakage currents and power consumption in a memory array comprising memory cells, such as 8T SRAM cells.

For example, an exemplary embodiment is directed to a method for reducing access power in a memory array comprising: dynamically placing a group of memory cells in the memory array in a reduced power state, and dynamically enabling a selected group of the memory cells during an access operation on the selected memory cells.

Another exemplary embodiment is directed to a method for reducing access power in a memory array comprising: dynamically placing write circuitry in a reduced power state, and dynamically enabling or disabling the write circuitry in response to a write request.

Yet another exemplary embodiment is directed to a memory array comprising logic for dynamically placing a group of memory cells in the memory array in a reduced power state, and logic for dynamically enabling a selected group of the memory cells during an access operation on the selected memory cells.

A further exemplary embodiment is directed to a memory array comprising: logic for dynamically placing write circuitry in a reduced power state, and logic for dynamically enabling or disabling the write circuitry in response to a write request.

Another exemplary embodiment is directed to a memory array comprising: means for dynamically placing a group of memory cells in the memory array in a reduced power state, and means for dynamically enabling a selected group of the memory cells during an access operation on the selected memory cells.

Yet another exemplary embodiment is directed to a non-transitory computer-readable storage medium comprising code, which, when executed by a processor, causes the processor to perform operations method for reducing access power in a memory array, the non-transitory computer-readable storage medium comprising: code for dynamically placing a group of memory cells in the memory array in a reduced power state, and code for dynamically enabling a selected group of the memory cells during an access operation on the selected memory cells.

A further exemplary embodiment is directed to a method for reducing access power in a memory array comprising: step for dynamically placing a group of memory cells in the memory array in a reduced power state, and step for dynamically enabling a selected group of the memory cells during an access operation on the selected memory cells.

Another exemplary embodiment is directed to a method for reducing access power in a memory array comprising: step for dynamically placing write circuitry in a reduced power state, and step for dynamically enabling or disabling the write circuitry in response to a write request.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to memory devices with reduced leakage power and improved performance during memory access operations such as reads and writes. Embodiments may include exemplary memory devices such as 8T SRAM cell structures configured for low leakage during an inactive state, and dynamic enablement during access operations. As will be described in detail hereinafter, embodiments may include a floating read bitline operatively coupled to a read port portion of exemplary memory devices, wherein the read bitline may be allowed to float when the memory device is in an inactive state, and may be precharged before and after access operations. As will also be described in detail hereinafter, embodiments may also include floating write bitlines and tristate write driver circuits configured to float the write bitlines during an inactive state of the memory device, such that leakage current paths may be effectively eliminated.

Figure 3:
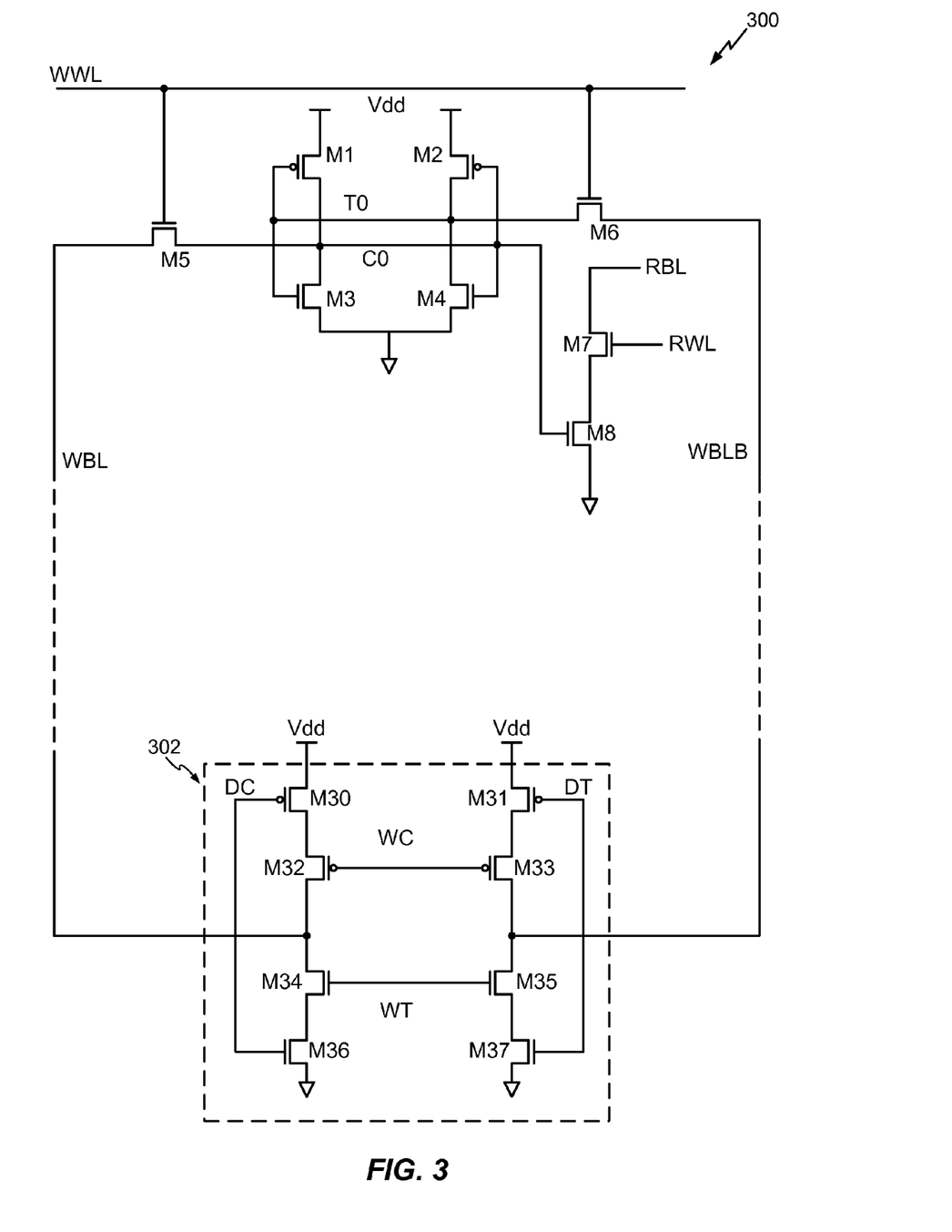
FIG. 3 illustrates an exemplary 8T SRAM cell configured for reduced power consumption.

With reference now to FIG. 3, exemplary 8T SRAM cell 300 is illustrated. In comparison with conventional 8T SRAM cell 200, the structure of 8T SRAM cell 300 may exclude precharge transistors M9 and M10 coupled to write bitlines WBL and WBLB. As previously noted, precharge transistors M9 and M10 contribute to forming leakage paths 202 and 204 in 8T SRAM cell 200. Accordingly, the elimination of these precharge transistors M9 and M10 may effectively eliminate leakage paths such as 202 and 204 arising from precharging write bitlines.

With continuing reference to FIG. 3, a tristate write driver 302 may be introduced in 8T SRAM 300, in place of precharge transistors such as M9 and M10. Tristate write driver 302 may comprise transistors M30-M37 as illustrated. In the illustrated embodiment, transistors M30-M33 may be p-channel MOS (PMOS) transistors, while transistors M34-M37 may be n-channel MOS (NMOS) transistors. Accordingly, when 8T SRAM 300 is in an inactive state, net WC may be driven to a high state (or voltage VDD, or logic "1"), causing PMOS transistors M32 and M33 to be turned off.

Similarly, net WT may be driven to a low state (or ground voltage, or logic "0"), causing NMOS transistors M34 and M35 to also be turned off. As a result, there is no conducting path to write bitlines WBL and WBLB, thereby causing them to float. In this manner, by controlling voltages of nets WC and WT, leakage paths from VDD to ground voltage may be effectively eliminated.

When 8T SRAM is in a write-active state of an active bank or set, the write bitlines WBL and WBLB can be driven to a high state through PMOS transistors M30-M33. As used herein, a "sub-bank" or "set" refers to a section of a memory array bank which may be independently controlled, and may be independently enabled or disabled. During the write operation, PMOS transistors M30-M33 may be turned on and in a conducting state by driving nets WC and complementary nets DC or DT to a low state. Because complementary nets DC and DT are also coupled to the gates of NMOS transistors M36 and M37, driving one of these nets low, also has the effect of turning off NMOS transistors M36 or M37 respectively. However, when 8T SRAM is in the inactive bank or set, the write bitlines are allowed to float. Accordingly, by driving voltages of nets WC and WT to high and low states respectively, leakage paths such as 202 from VDD to ground (as illustrated in FIG. 2), may be effectively eliminated.

Exemplary implementations of 8T SRAM cell 300 may also be configured to effectively eliminate leakage paths, such as 206 arising from precharging read bitlines (as illustrated in FIG. 2). In order to eliminate such leakage paths from precharging read bitlines, embodiments may include logic configured to float read bitline RBL during an inactive state of 8T SRAM cell 300. The logic may be further configured to precharge read bitline RBL before and after access operations are performed on 8T SRAM cell 300. Further details for implementing such logic for selectively and dynamically floating read bitlines in an SRAM array comprising cells such as 8T SRAM cell 300, are discussed in the following sections.

Figure 4A:
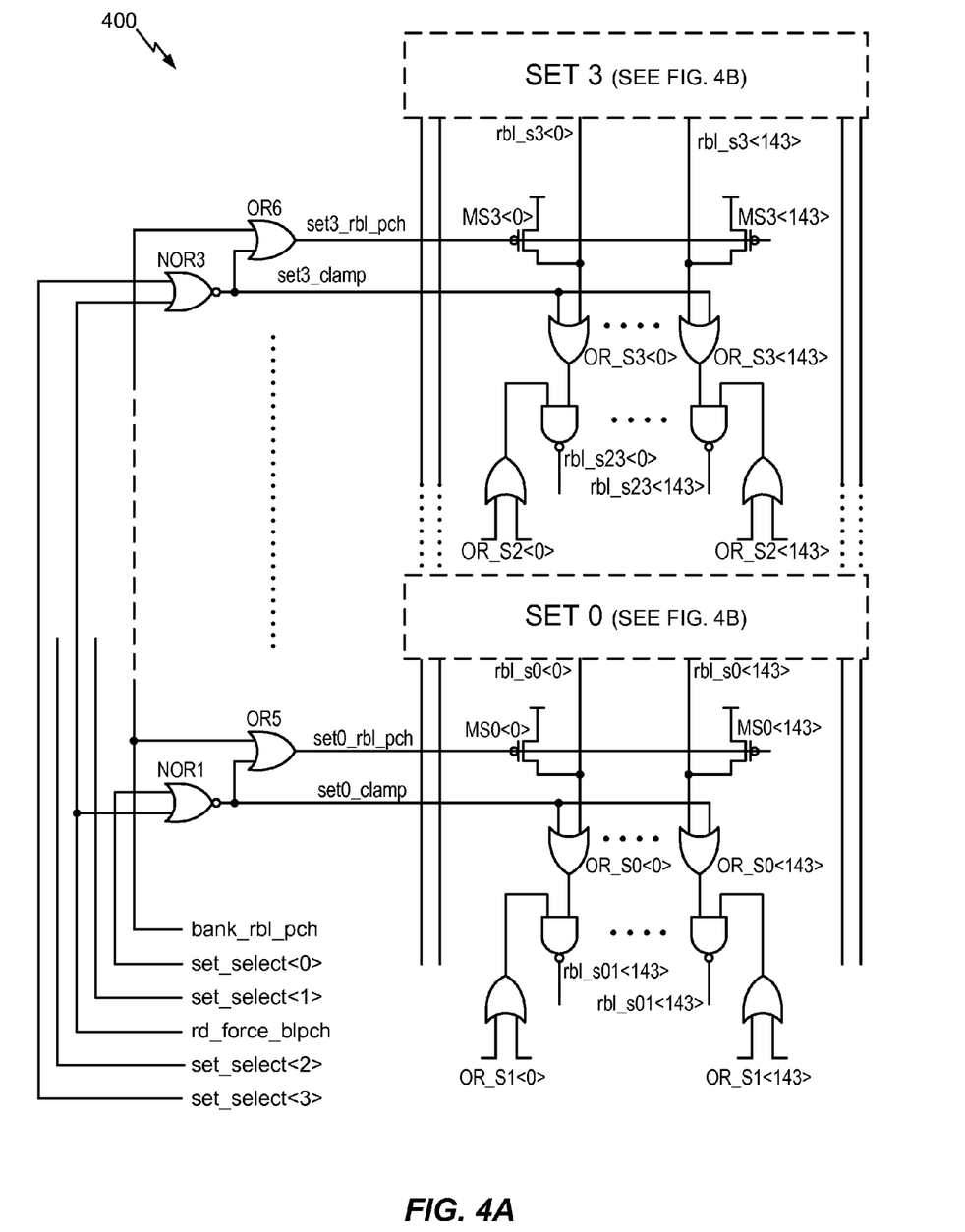
FIG. 4A illustrates an exemplary memory array bank, comprising 8T SRAM cells configured for reduced power consumption during access operations.
Figure 4B:
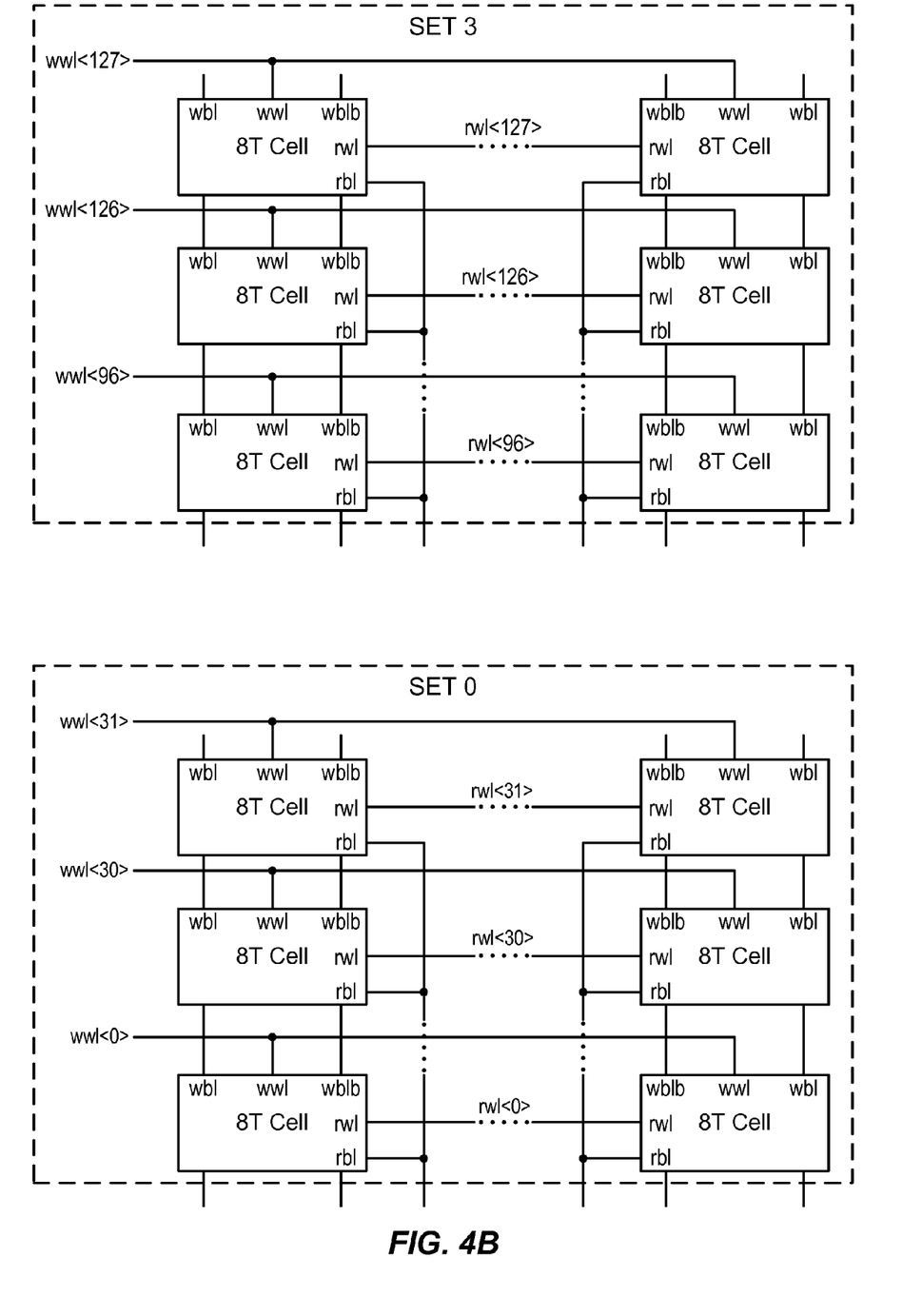
FIG. 4B illustrates an expanded view of selected sets of the memory array bank illustrated in FIG. 4A.

With combined reference now to FIGS. 4A-B, exemplary circuits for implementing floating read bitlines in exemplary SRAM memory array bank, bank 400 are illustrated. In the illustrated embodiment, bank 400 may be one of several memory array banks of a memory system. Bank 400 is divided into four sets: SET 0-3, but only SET 0 and SET 3 are illustrated in FIG. 4A for the sake of simplicity. FIG. 4B provides an expanded view of SET 0 and SET 3. Bank 400 comprises 128 rows and 144 columns of 8T SRAM cells, wherein each of sets SET 0-3 comprise 32 rows and 144 columns. While the illustrated embodiment has been directed to bank 400 partitioned into the four sets as above, exemplary embodiments are not necessarily limited to such partitioning. Disclosed techniques can be easily extended to memory systems comprising banks, sets, or other forms of partitioning known in the art.

With continuing reference to FIG. 4A, control signals SET_SELECT [3:0] may be configured as one-hot signals used to enable one of the four sets of bank 400. As shown in FIG. 4B, SET 0 comprises rows 31:0, and SET 3 comprises rows 127:96.

The following control signals will be described with reference to SET 3 as shown in FIG. 4B, while it will be understood that similar descriptions apply to sets SET 0-2. Write word lines wwl [127:96] and read word lines rwl [127:96] for enabling 8T SRAM cells during write and read operations in a selected row of SET 3 may be disposed in the row direction. Complementary write bitlines wbl and wblb for each 8T SRAM cell may be derived from write circuits disposed in the column direction. Read bitlines may be derived from control signals rbl_s3 [143:0]. Read bitlines rbl_s3 [143:0] may be configured such that they are only enabled when SET 3 is selected, and floating when corresponding 8T SRAM cells are inactive and SET 3 is unselected. Further, read bitlines rbl_s3 [143:0] may be configured such that selected 8T SRAM cells may be precharged before and after access operations. Further detailed operation of control signals operative on bank 400 is provided below with a timing diagram illustrated in FIG. 5.

Figure 5:
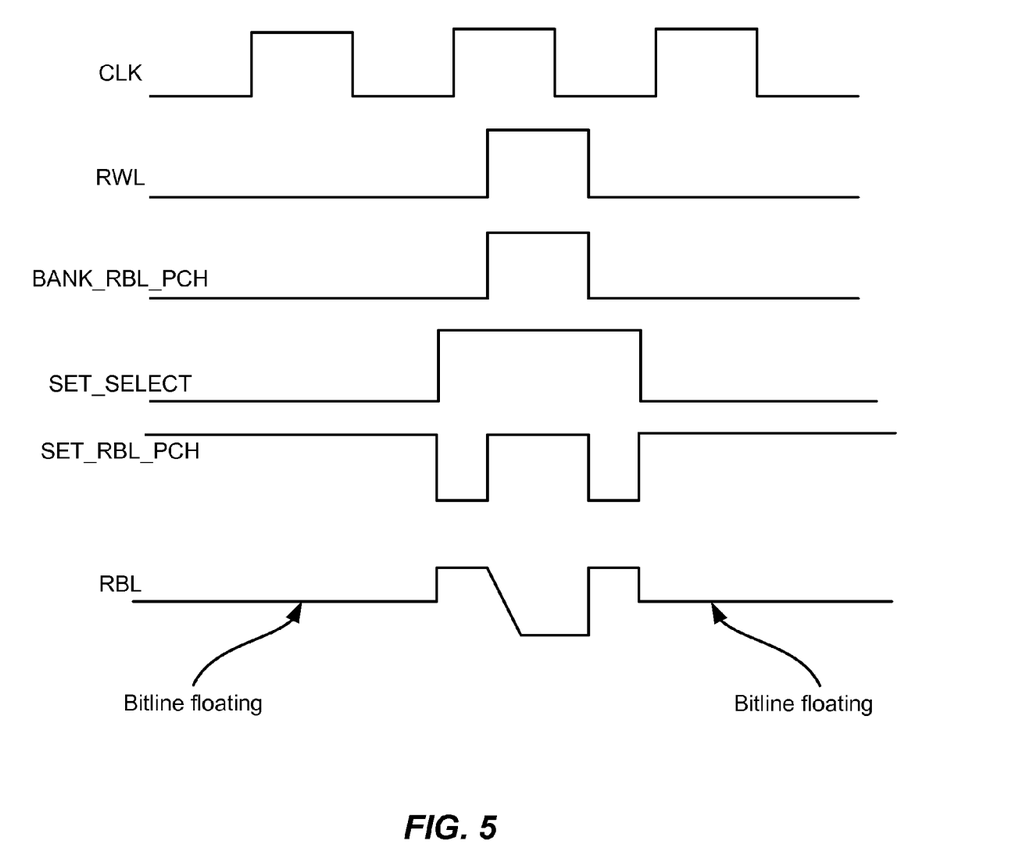
FIG. 5 is a timing diagram illustrating timing relationships for selected control signals of the memory array of FIG. 4A.

The timing diagram of FIG. 5 illustrates clock signal CLK used to clock SRAM array 400. The control signal bank_rbl_pch may be configured for controlling precharge operations. The one-hot control signals SET_SELECT [3:0] may be made available prior to the arrival of bank_rbl_pch. The signal rd_force_blpch corresponds to a test mode of operation, and may be set low during an active mode. Accordingly, when SET 3 is required to be selected during an active mode of operation, SET_SELECT [3] is high, and SET_SELECT [2:0] test pin rd_force_blch are low. Correspondingly, gates NOR3 and OR6 allow bank_rbl_pch to propagate to the gated signal set3_rbl_pch in order to precharge read bitlines rbl_s3 [143:0] for selected SET 3 alone, and not sets SET 0-2. In an example when a particular 8T SRAM cell in SET 3 is accessed during a read operation, the corresponding read word line RWL is high. As shown in the timing diagram of FIG. 5, the gated signal set3_rbl_pch is on before and after the duration of read word line RWL. Thus, during an active mode of operation, gated signal set3_rbl_pch may be configured as above to precharge selected read bitlines before and after access operations. As detailed below with an unselected set, SET 0, the corresponding read bitlines may be allowed to float during inactive modes.

Continuing with the above example wherein SET 3 is enabled, one-hot control signals for sets SET 0-2 are low. Accordingly, with reference again to FIGS. 4A-B, the signals set0_clamp and set0_rbl_pch are high through gates NOR1 and OR5. The signal set0_rbl_pch operates to shut off PMOS transistors MS0 [143:0] (similar to PMOS transistor M11 in FIG. 2), such that corresponding read bitlines rbl_s0 [143:0] are allowed to float. In this manner, for unselected sets SET 0-2, the read bitlines may be allowed to float, thus preventing leakage paths from continuous precharging. Further, in order to prevent unknown states caused by floating read bitlines, from propagating to downstream circuits, the signal set0_clamp being high, will clamp the output of control signals OR_S0 [143:0] to low state. While not explicitly illustrated, the signals set1_clamp, set2_clamp will also clamp the output of control signals OR_S1 [143:0], and OR_S2 [143:0] to low state. In contrast, since set3_clamp for selected SET 3 is low and the output of OR_S2 [143:0] for unselected SET 2 is low, the signal rbl_s3 [143:0] may be allowed to propagate to downstream circuits through the signals rbl_s23 [143:0] as shown.

Figure 6:
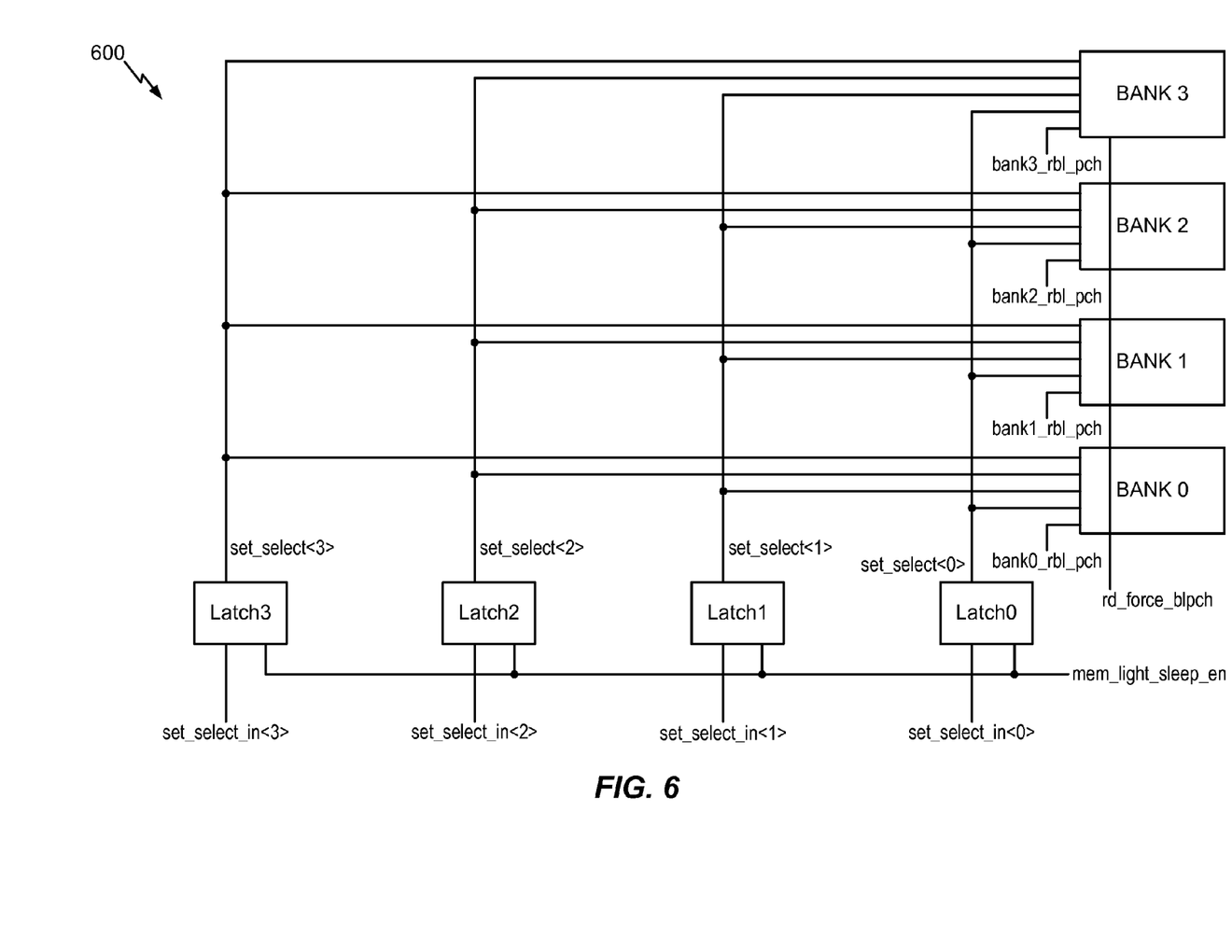
FIG. 6 illustrates an exemplary memory array configured for reduced power during a light sleep mode.
Figure 7:
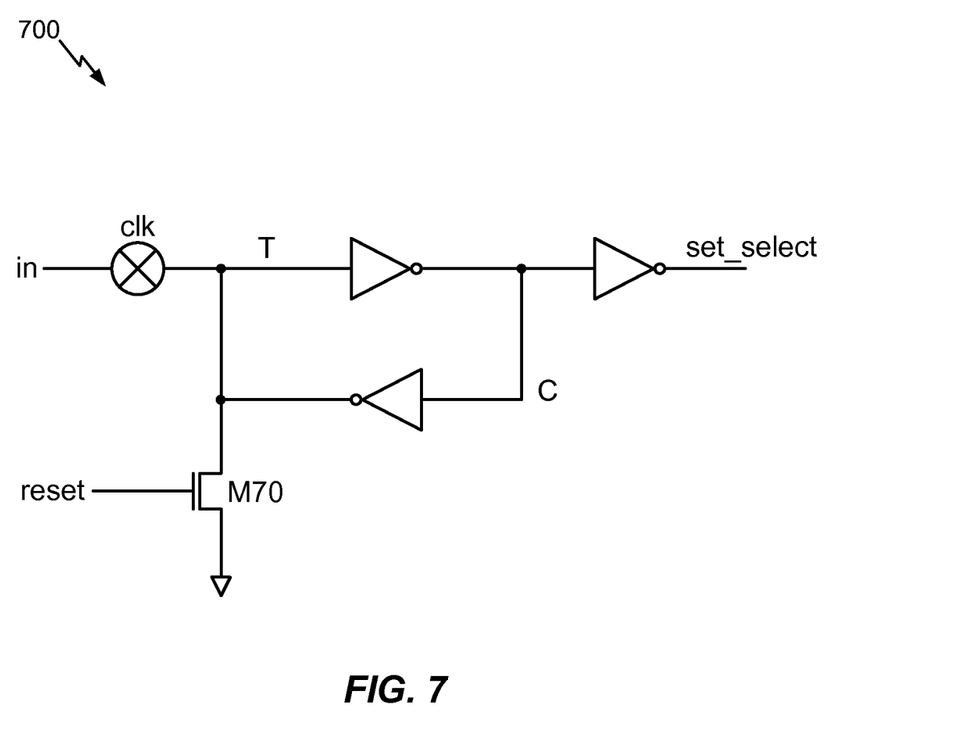
FIG. 7 illustrates a latch configured for use in the exemplary memory array of FIG. 6 during a light sleep mode.

With combined reference now to FIGS. 6-7, memory system 600 comprising four SRAM array banks BANK 0-3 is illustrated. Each of the four SRAM array banks, BANK 0-3, may be formed of an SRAM array such as bank 400 of FIGS. 4A-B. Accordingly, each of banks BANK 0-3 may each comprise four sets SET 0-3, as in bank 400. The banks BANK 0-3 may be configured for a light sleep mode or inactive state, wherein none of the banks BANK 0-3 and none of the sets SET 0-3 are active. Similar to bank 400, control signals set_select [3:0] may be used to enable sets SET 0-3 of banks BANK 0-3. The signal mem_light sleep may be used to place banks BANK 0-3 in light sleep mode.

With reference to FIG. 7 the circuit implementation of latch 700 which may be used in latches Latch 0-3 in FIG. 6 is illustrated. The signal mem_light_sleep may be coupled to the reset pin, controlling the gate of NMOS transistor 70 of latch 700. In turn, the internal node T of latch 700 may be forced to a low state when mem_light_sleep is high. Thus, the set_select output of latch 700 may be forced to a low state.

Accordingly, with reference to FIG. 6, when all four banks BANK 0-3 are in light sleep mode, all one-hot control signals set_select [3:0] may be forced low. As described with regard to bank 400 of FIGS. 4A-B, forcing all of control signals SET_SELECT [3:0] to low state causes all the read bitlines rbl_s3 [143:0], rbl_s2 [143:0], rbl_s1 [143:0], and rbl_s0 [143:0], corresponding to SET 0-3 respectively, to float. Thus, leakage current (for example, through PMOS transistor M11 of FIG. 2) may be eliminated when bank 400 is in light sleep mode and sets SET 0-3 are inactive. In like manner, forcing set_select [3:0] in memory system 600 of FIG. 6, may have the effect of causing read bitlines of banks BANK 0-3 (not shown) to float, thus eliminating leakage current. In this manner, power consumption may be minimized in exemplary 8T SRAM cells of memory system 600 comprising banks BANK 0-3.

Figure 8:
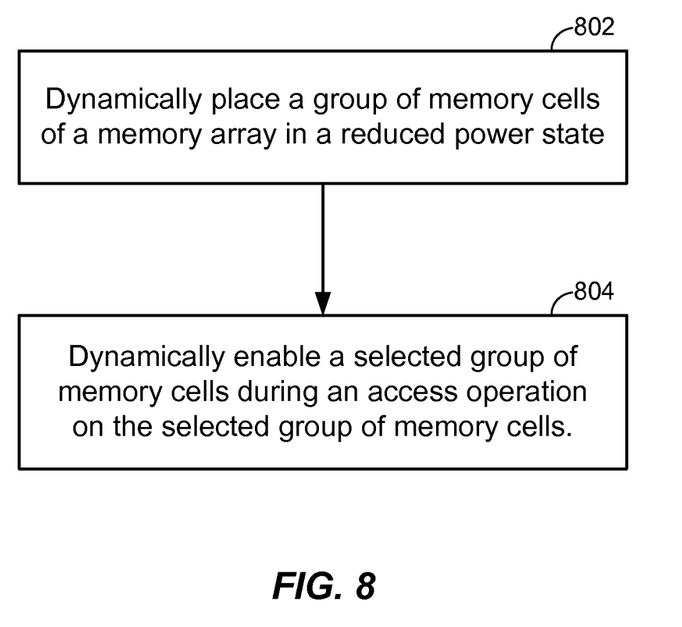
FIG. 8 illustrates a flow chart according to a method for implementing disclosed embodiments.

It will be appreciated that embodiments include various methods for performing the processes, functions and/or algorithms disclosed herein. For example, as illustrated in FIG. 8, an embodiment can include a method for reducing power consumption in a memory array, such as bank 400, comprising: dynamically placing a group of memory cells (for example, SET 3 comprising 8T SRAM cells, as illustrated in FIGS. 4A-B) in the memory array in a reduced power state (for example, by controlling the signal SET_SELECT [3]—Block 802); and dynamically enabling a selected group of memory cells during an access operation on the selected group of memory cells (for example, enabling SET 3 by controlling SET_SELECT[3] and read and write word lines and bitlines as described above during read and write operations respectively—Block 804).

Moreover while the above embodiments have been described with reference to a single read port and a single write port, such as ports coupled to read and write word lines and bitlines in exemplary 8T SRAM cells 300, embodiments are not limited to single read or write ports. The techniques described herein may be easily extended to two or more read ports and/or two or more write ports. For example, with reference to FIG. 9, exemplary 12T SRAM cell 900 with two read ports and two write ports is illustrated. 12T SRAM cell 900 generally retains the elements described with reference to 8T SRAM cell 300 while adding an additional read port and an additional write port.

Figure 9:
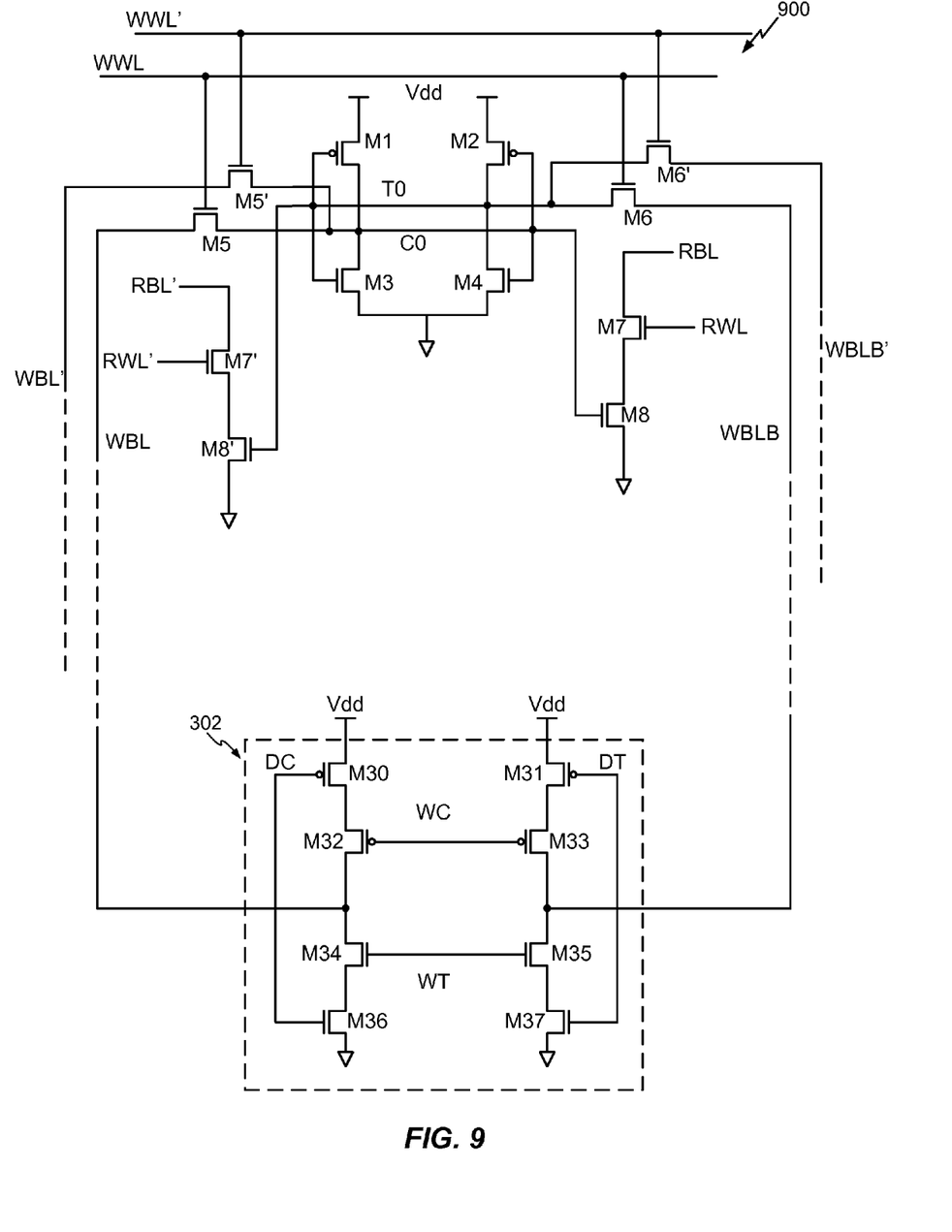
FIG. 9 illustrates an exemplary 12T SRAM cell configured to support two read ports and two write ports.

With continuing reference to FIG. 9, in 12T SRAM cell 900, transistors M7' and M8' are introduced in addition to the elements illustrated in 8T SRAM cell 300 of FIG. 3. These transistors M7' and M8' may be coupled to read bitline RBL' and read word line RWL' in order to support an additional read port (not shown). Similarly, transistors M5' and M6' coupled to write word line WWL' and complementary write bitlines WBL' and WBLB' may support an additional write port. As with read bitline RBL described with reference to 8T SRAM cell 300, read bitline RBL' may be configured to float during an inactive state of 12T SRAM cell 900, thus eliminating leakage paths such as 206, illustrated in FIG. 2. Similarly, as with complementary write bitlines WBL and WBLB, a tristate write driver such as tristate write driver 302, may be used to eliminate leakage paths such as 202 and 204 arising from transistors M5' and M6'. In like manner, the techniques for eliminating leakage paths may be extended to any number of additional read or write ports. Accordingly, exemplary embodiments may eliminate leakage paths for 12T SRAM cells with two or more read ports and/or two or more write ports.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for reducing power consumption in a memory array. Accordingly, the invention is not limited to illustrated examples and any means for performing the functionality described herein are included in embodiments of the invention.

Figure 10:
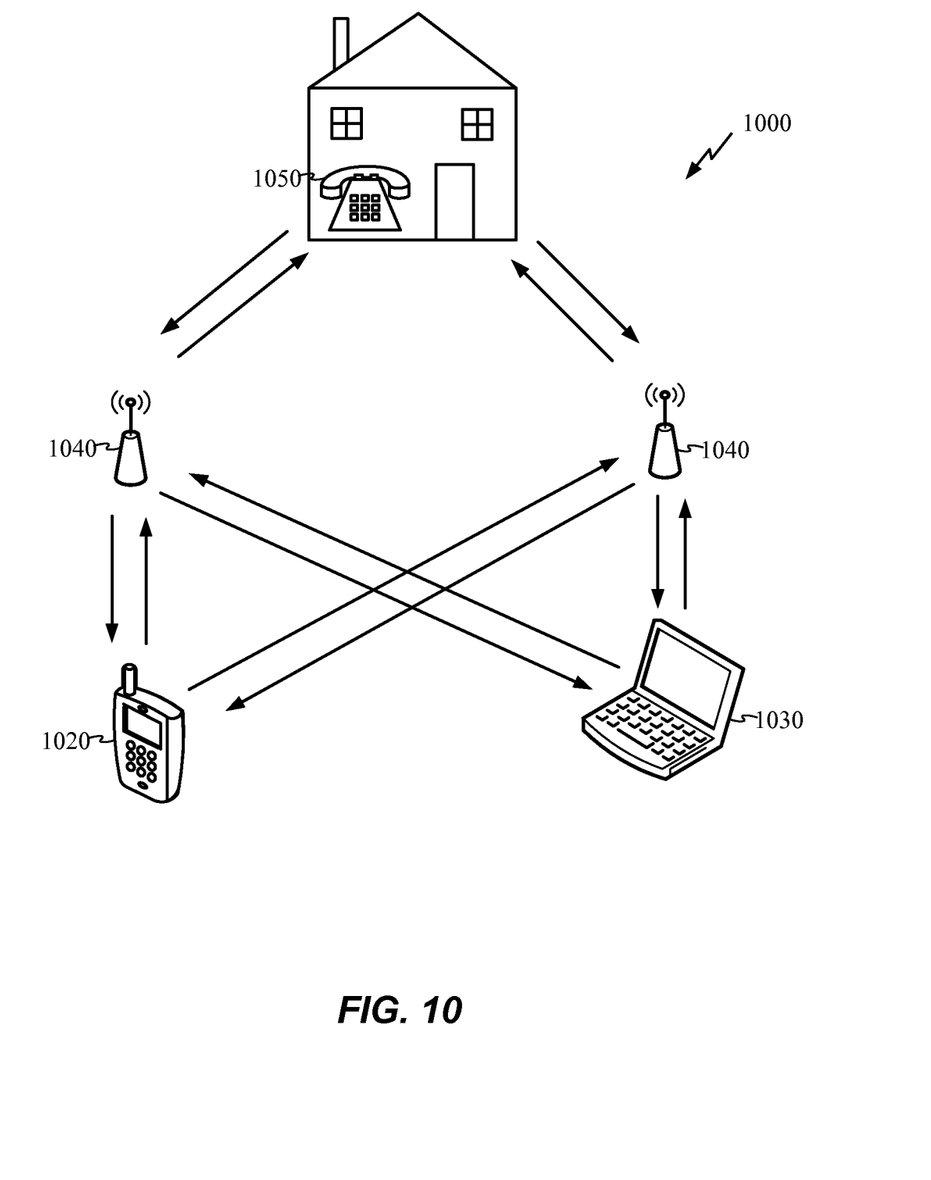
FIG. 10 illustrates an exemplary wireless communication system 900 in which an embodiment of the disclosure may be advantageously employed.

FIG. 10 illustrates an exemplary wireless communication system 1000 in which an embodiment of the disclosure may be advantageously employed. For purposes of illustration, FIG. 10 shows three remote units 1020, 1030, and 1050 and two base stations 1040. In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 10 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for reducing access power in a memory array comprising:
   dynamically placing a group of memory cells in the memory array in a reduced power state; and
   dynamically enabling a selected group of the memory cells during an access operation on the selected memory cells.

2. The method of claim 1, wherein the access operation comprises a read.

3. The method of claim 1, wherein the access operation comprises a write.

4. The method of claim 1, wherein the memory cells include an 8 transistor Static Random Access Memory (8T SRAM) cell, such that forming the 8T SRAM cell comprises:
   forming a storage element;
   coupling a write word line and a pair of complementary write bitlines to the storage element through two write access transistors; and
   coupling the storage element to a read word line and a read bitline through two read access transistors.

5. The method of claim 4, further comprising, for a read operation, dynamically precharging selected read bitlines before and after the read operation on the 8T SRAM cell.

6. The method of claim 4, further comprising dynamically placing the read bitline in a floating state during an inactive mode of the 8T SRAM cell.

7. The method of claim 4, further comprising, for a write operation, dynamically precharging the pair of complementary bitlines before and after the write operation on the 8T SRAM cell.

8. The method of claim 4, further comprising configuring a tristate write driver to dynamically place the pair of complementary write bitlines in a floating state during an inactive mode of the 8T SRAM cell.

9. The method of claim 4, further comprising, during a light sleep mode, floating all read and write bitlines of the memory array.

10. The method of claim 1, wherein the group of memory cells belong to a set.

11. The method of claim 1, wherein the group of memory cells belong to a bank.

12. The method of claim 1, wherein an 8T SRAM cell comprises two or more read ports.

13. The method of claim 1, wherein the 8T SRAM cell comprises two or more write ports.

14. A method for reducing access power in a memory array comprising:
   dynamically placing write circuitry in a reduced power state; and
   dynamically enabling or disabling the write circuitry in response to a write request.

15. A memory array comprising:
   logic for dynamically placing a group of memory cells in the memory array in a reduced power state; and
   logic for dynamically enabling a selected group of the memory cells during an access operation on the selected memory cells.

16. The memory array of claim 15, wherein the access operation comprises a read.

17. The memory array of claim 15, wherein the access operation comprises a write.

18. The memory array of claim 15, wherein the memory cells include an 8 transistor Static Random Access Memory (8T SRAM) cell, such that the 8T SRAM cell comprises:
   a storage element;
   at least one write word line and at least one pair of complementary write bitlines coupled to the storage element through at least one pair of write access transistors; and
   at least one read word line and at least one read bitline coupled to the storage element through at least one pair of read access transistors.

19. The memory array of claim 18, further comprising a second write word line and a second pair of complementary write bitlines coupled to the storage element through a second pair of write access transistors; and
   a second read word line and a second read bitline coupled to the storage element through a second pair of read access transistors.

20. The memory array of claim 18, further comprising, logic for dynamically precharging selected read bitlines before and after a read operation on the 8T SRAM cell.

21. The memory array of claim 18, further comprising logic for dynamically placing selected read bitlines in a floating state during an inactive mode of the 8T SRAM cell.

22. The memory array of claim 18, further comprising, logic for dynamically precharging selected complementary bitlines before and after a write operation on the 8T SRAM cell.

23. The memory array of claim 18, further comprising a tristate write driver configured to dynamically place selected complementary write bitlines in a floating state during an inactive mode of the 8T SRAM cell.

24. The memory array of claim 18, further comprising, logic for floating all read and write bitlines of the memory array during a light sleep mode.

25. The memory array of claim 18, wherein the group of memory cells belong to a set.

26. The memory array of claim 18, wherein the group of memory cells belong to a bank.

27. The memory array of claim 15 integrated in at least one semiconductor die.

28. The memory array of claim 15 integrated into a device, selected from the group consisting of a set top box, music player, video player, entertainment unit, navigation device, communications device, personal digital assistant (PDA), fixed location data unit, and a computer.

29. A memory array comprising:
   logic for dynamically placing write circuitry in a reduced power state; and
   logic for dynamically enabling or disabling the write circuitry in response to a write request.

30. The memory array of claim 29, wherein the logic for dynamically enabling or disabling the write circuitry comprises precharge transistors configured to drive complementary write bitlines.

31. The memory array of claim 30, wherein the precharge transistors are PMOS transistors coupled to positive power supply voltage VDD.

32. The memory array of claim 29, wherein the logic for dynamically placing the write circuitry in reduced power state comprises PMOS transistors configured to disable a path from positive power supply voltage VDD to complementary write bitlines in response to a sleep signal, and NMOS transistors configured to disable a path from the complementary write bitlines to ground voltage in response to a sleep signal.

33. The memory array of claim 29 comprising two or more read ports.

34. The memory array of claim 29 comprising two or more write ports.

35. The memory array of claim 29 integrated in at least one semiconductor die.

36. The memory array of claim 29 integrated into a device, selected from the group consisting of a set top box, music player, video player, entertainment unit, navigation device, communications device, personal digital assistant (PDA), fixed location data unit, and a computer.

37. A memory array comprising:
 means for dynamically placing a group of memory cells in the memory array in a reduced power state; and
 means for dynamically enabling a selected group of the memory cells during an access operation on the selected memory cells.

38. The memory array of claim 37, wherein the means for dynamically enabling further comprises means for dynamically precharging selected read bitlines before and after a read access operation on the selected memory cells.

39. The memory array of claim 37, wherein the means for dynamically enabling further comprises means for dynamically precharging a pair of complementary write bitlines before and after a write access operation on the selected memory cells.

40. The memory array of claim 37, wherein the group of memory cells belong to a set.

41. The memory array of claim 37, wherein the group of memory cells belong to a bank.

42. The memory array of claim 37 integrated in at least one semiconductor die.

43. The memory array of claim 37 integrated into a device, selected from the group consisting of a set top box, music player, video player, entertainment unit, navigation device, communications device, personal digital assistant (PDA), fixed location data unit, and a computer.

44. A non-transitory computer-readable storage medium comprising code, which, when executed by a processor, causes the processor to perform operations method for reducing access power in a memory array, the non-transitory computer-readable storage medium comprising:
 code for dynamically placing a group of memory cells in the memory array in a reduced power state; and
 code for dynamically enabling a selected group of the memory cells during an access operation on the selected group of the memory cells.

45. A method for reducing access power in a memory array comprising:
 step for dynamically placing a group of memory cells in the memory array in a reduced power state; and
 step for dynamically enabling a selected group of the memory cells during an access operation on the selected memory cells.

46. The method of claim 45, wherein the access operation comprises a read.

47. The method of claim 45, wherein the access operation comprises a write.

48. The method of claim 45, wherein the memory cells include an 8 transistor Static Random Access Memory (8T SRAM) cell, such that forming the 8T SRAM cell comprises:
 step for forming a storage element;
 step for coupling a write word line and a pair of complementary write bitlines to the storage element through two write access transistors; and
 step for coupling the storage element to a read word line and a read bitline through two read access transistors.

49. The method of claim 48, further comprising, for a read operation, step for dynamically precharging selected read bitlines before and after the read operation on the 8T SRAM cell.

50. The method of claim 48, further comprising step for dynamically placing the read bitlines in a floating state during an inactive mode of the 8T SRAM cell.

51. The method of claim 48, further comprising, for a write operation, step for dynamically precharging the pair of complementary bitlines before and after a write operation on the 8T SRAM cell.

52. The method of claim 48, further comprising step for configuring a tristate write driver to dynamically place the pair of complementary write bitlines in a floating state during an inactive mode of the 8T SRAM cell.

53. The method of claim 48, further comprising, during a light sleep mode, step for floating all read and write bitlines of a memory array.

54. The method of claim 45, wherein the group of memory cells belong to a set.

55. The method of claim 45, wherein the group of memory cells belong to a bank.

56. The method of claim 45, wherein the 8T SRAM cell comprises two or more read ports.

57. The method of claim 45, wherein the 8T SRAM cell comprises two or more write ports.

58. A method for reducing access power in a memory array comprising:
 step for dynamically placing write circuitry in a reduced power state; and
 step for dynamically enabling or disabling the write circuitry in response to a write request.

* * * * *